(12) United States Patent
Colvin et al.

(10) Patent No.: US 10,535,498 B2
(45) Date of Patent: Jan. 14, 2020

(54) LANTHANATED TUNGSTEN ION SOURCE AND BEAMLINE COMPONENTS

(71) Applicant: Axcelis Technologies, Inc., Beverly, MA (US)

(72) Inventors: Neil K. Colvin, Merrimack, NH (US); Tseh-Jen Hsieh, Rowley, MA (US); Paul B. Silverstein, Somerville, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 16/102,868

(22) Filed: Aug. 14, 2018

(65) Prior Publication Data

US 2018/0358202 A1 Dec. 13, 2018

Related U.S. Application Data

(63) Continuation of application No. 15/592,857, filed on May 11, 2017, now abandoned.
(Continued)

(51) Int. Cl.
*H01J 37/30* (2006.01)
*H01J 37/08* (2006.01)
(Continued)

(52) U.S. Cl.
CPC .......... *H01J 37/3002* (2013.01); *H01J 37/08* (2013.01); *H01J 37/3171* (2013.01); *H01J 2237/061* (2013.01)

(58) Field of Classification Search
CPC .... H01J 37/3002; H01J 37/3171; H01J 37/08; C22C 45/10; C22C 27/02; C22C 27/04
See application file for complete search history.

(56) References Cited

U.S. PATENT DOCUMENTS

| 4,083,811 A | 4/1978 | Bachmann |
| 4,261,753 A * | 4/1981 | Holcombe .......... C04B 35/5156 501/152 |

(Continued)

FOREIGN PATENT DOCUMENTS

| CN | 106498360 A | 3/2017 |
| JP | 2001093431 A | 4/2001 |

OTHER PUBLICATIONS

International Search Report dated Jul. 28, 2017 in connection with PCT Application PCT/US2017/032603.
(Continued)

*Primary Examiner* — Wyatt A Stoffa
*Assistant Examiner* — Sean M Luck
(74) *Attorney, Agent, or Firm* — Eschweiler & Potashnik, LLC (57) ABSTRACT

An ion implantation system is provided having one or more conductive components comprised of one or more of lanthanated tungsten and a refractory metal alloyed with a predetermined percentage of a rare earth metal. The conductive component may be a component of an ion source, such as one or more of a cathode, cathode shield, a repeller, a liner, an aperture plate, an arc chamber body, and a strike plate. The aperture plate may be associated with one or more of an extraction aperture, a suppression aperture and a ground aperture.

14 Claims, 7 Drawing Sheets

Related U.S. Application Data (60) Provisional application No. 62/336,246, filed on May 13, 2016.

(51) Int. Cl.
  *H01J 37/31* (2006.01)
  *H01J 37/317* (2006.01)

(56) References Cited

U.S. PATENT DOCUMENTS

| | | | | |
|---|---|---|---|---|
| 4,274,030 | A * | 6/1981 | Buxbaum | H01J 1/28 252/514 |
| 4,275,123 | A * | 6/1981 | Buxbaum | H01J 1/28 313/346 R |
| 4,309,467 | A * | 1/1982 | Kovach | C04B 35/5156 264/122 |
| 5,497,006 | A | 3/1996 | Sferlazzo | |
| 5,590,386 | A * | 12/1996 | Patrician | B22F 3/23 419/20 |
| 5,874,805 | A * | 2/1999 | Kavanagh | H01J 9/02 313/311 |
| 2007/0172378 | A1* | 7/2007 | Shibuya | B22F 3/15 419/20 |
| 2009/0093739 | A1 | 4/2009 | Voss | |
| 2011/0017712 | A1 | 1/2011 | Wada | |
| 2011/0239542 | A1 | 10/2011 | Liu et al. | |
| 2011/0272383 | A1 | 11/2011 | Jarvis | |
| 2013/0193116 | A1 | 8/2013 | Wada et al. | |
| 2015/0329953 | A1* | 11/2015 | Molz | H05H 1/34 427/446 |
| 2016/0211137 | A1 | 7/2016 | Tang et al. | |
| 2017/0018811 | A1* | 1/2017 | Bradwell | H01M 2/065 |
| 2017/0207057 | A1 | 7/2017 | Colvin et al. | |

OTHER PUBLICATIONS

Wolfram—Tungsten; Feb. 23, 2009, XP055213392 URL:https://web.archive.org/web/20090223065631/http://www.plansee.com/lib/Tungsten_DE.pdf, pp. 1-36.

Haublein V., et al.; "Investigation of lanthanum contamination from a lanthanated tungsten ion source"; Ion Implantation Technology, 2002, Proceedings of the 14th International Conference on IEEE, Sep. 22, 2003, pp. 346-349.

Neil K Colvin; "Multi-Piece Electrode Aperture"; Jul. 20, 2017; URL:https://portal.uspto.gov/pair/PublicPair.

Hsieh Tseh-Jen et al.; "Exemplary Ion Source for the Implanting of Halogen and Oxygen Based Dopant Gases;" 2016 21st International Conference on Ion Implantation Technology, IEEE, Sep. 26, 2016, pp. 1-4.

Final Office Action dated Apr. 4, 2018 in connection with U.S. Appl. No. 15/592,857.

Non-Final Office Action dated Nov. 1, 2017 in connection with U.S. Appl. No. 15/592,857.

* cited by examiner

| Compound | Melting point: | Boiling point: | Appearance |
|---|---|---|---|
| $LaF_3$ | 1493°C | 2327°C | crystalline solid |
| $La_2O_3$ | 2305°C | 4200°C | solid |
| $WF_6$ | 2°C | 17°C | gas |
| $WF_4$ | 800°C | n/a | solid |
| $WO_2$ | 1500°C | 1730°C | crystalline solid |
| $WO_3$ | 1473°C; 1470°C | 1837°C | solid |

Fig. 9

LANTHANATED TUNGSTEN ION SOURCE AND BEAMLINE COMPONENTS

REFERENCE TO RELATED APPLICATIONS

This application is a Continuation of U.S. application Ser. No. 15/592,857 filed May 11, 2017, which claims the benefit of U.S. Provisional Application No. 62/336,246 filed May 13, 2016, entitled "LANTHANATED TUNGSTEN ION SOURCE AND BEAMLINE COMPONENTS", the contents of which are herein incorporated by reference in their entirety.

TECHNICAL FIELD

The present invention relates generally to ion implantation systems, and more specifically to an improved ion source and beamline components that improve a lifetime, stability, and operation of various aspects of an ion implantation system.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Ion sources (commonly referred to as arc ion sources) generate ion beams used in implanters and can include heated filament cathodes for creating ions that are shaped into an appropriate ion beam for wafer treatment. U.S. Pat. No. 5,497,006 to Sferlazzo et al., for example, discloses an ion source having a cathode supported by a base and positioned with respect to a gas confinement chamber for ejecting ionizing electrons into the gas confinement chamber. The cathode of the Sferlazzo et al. is a tubular conductive body having an endcap that partially extends into the gas confinement chamber. A filament is supported within the tubular body and emits electrons that heat the endcap through electron bombardment, thereby thermionically emitting ionizing electrons into the gas confinement chamber.

Conventional ion source gases such as fluorine or other volatile corrosive species can etch the inner diameter of cathode and repeller seals over time, thereby allowing the volatile gases to escape and damage nearby insulators, such as a repeller assembly insulator. This leakage will shorten the useful lifetime of the ion source, thus resulting in shutting down of the ion implanter in order to replace parts therein.

SUMMARY

The present disclosure thus provides a system and apparatus for increasing the lifetime of an ion source. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect of the disclosure, an ion implantation system is provided having one or more conductive components comprised of lanthanated tungsten and one or more of a refractory metal alloyed with a predetermined percentage of a rare earth metal. In one example, an ion source is provided, comprising an arc chamber having a body defining and interior region of the arc chamber. A liner is operably coupled to the body of the arc chamber. In accordance with another exemplary aspect, an electrode having a shaft and a head is further provided, wherein the shaft passes through the body and the hole in the liner. The shaft is further electrically isolated from the liner. The electrode, for example, may comprise one or more of a cathode, repeller, anti-cathode, and cathode shield.

The conductive component that is comprised of lanthanated tungsten and one or more of the refractory metal alloyed with the predetermined percentage of a rare earth metal may be a component of the ion source, such as one or more of the cathode, cathode shield, repeller, liner, an aperture plate, an arc chamber body, and a strike plate. The aperture plate may be associated with one or more of an extraction aperture, a suppression aperture and a ground aperture.

In accordance with another exemplary aspect of the disclosure, an ion source, such as an ion source for an ion implantation system, is provided. The ion source, for example, comprises the arc chamber and a gas source, wherein the gas source is further configured to introduce a gas to the interior region of the arc chamber body.

In another example, the ion source comprises a repeller disposed opposite the cathode. An arc slit may be further provided in the arc chamber for extraction of ions from the arc chamber.

To the accomplishment of the foregoing and related ends, the disclosure comprises the features hereinafter fully described and particularly pointed out in the claims. The following description and the annexed drawings set forth in detail certain illustrative embodiments of the invention.

These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

The present disclosure is directed generally toward an ion implantation system and an ion source associated therewith. More particularly, the present disclosure is directed toward components for said ion implantation system that are comprised of lanthanated tungsten for improved lifetime, stability, and operation of the ion implantation system.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Figure 1:
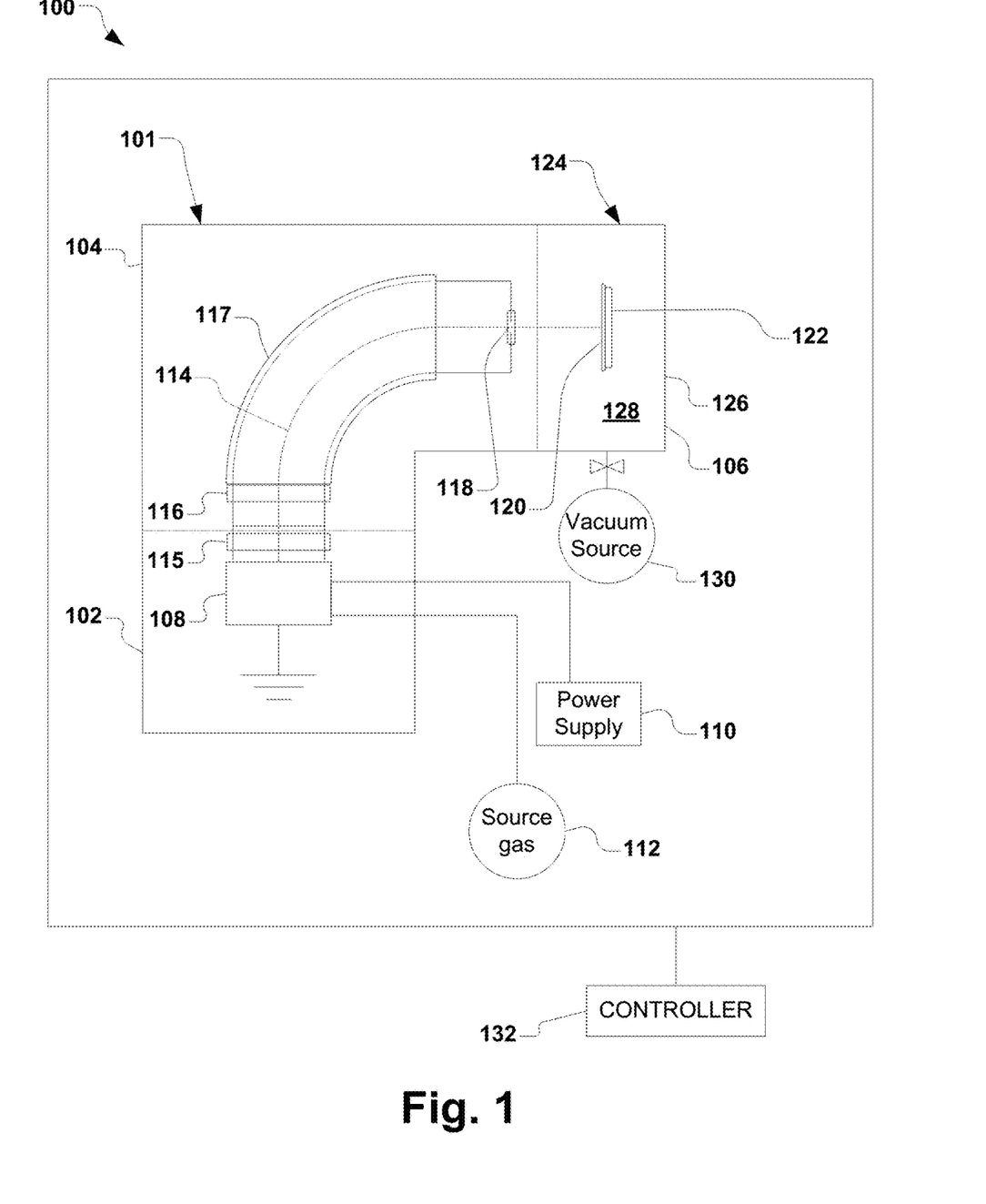
FIG. 1 is a block diagram of an exemplary vacuum system utilizing an ion source cathode shield in accordance with several aspects of the present disclosure.

Referring now to the Figures, in accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110, whereby a source gas 112 (also called a dopant gas) supplied thereto is ionized into a plurality of ions to form an ion beam 114 that is extracted via extraction electrodes 115. The ion beam 114 in the present example is directed through an entrance 116 of a mass analyzer 117 (e.g., a beam-steering apparatus), and out an aperture 118 towards the end station 106. In the end station 106, the ion beam 114 bombards a workpiece 120 (e.g., a semiconductor such as a silicon wafer, a display panel, etc.), which is selectively clamped or mounted to a chuck 122 (e.g., an electrostatic chuck or ESC). Once embedded into the lattice of the workpiece 120, the implanted ions change the physical and/or chemical properties of the workpiece. Because of this, ion implantation is used in semiconductor device fabrication and in metal finishing, as well as various applications in materials science research.

The ion beam 114 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 124, such as a vacuum chamber 126, wherein a process environment 128 is associated with the process chamber. The process environment 128 generally exists within the process chamber 124, and in one example, comprises a vacuum produced by a vacuum source 130 (e.g., a vacuum pump) coupled to the process chamber and configured to substantially evacuate the process chamber. Further, a controller 132 is provided for overall control of the vacuum system 100.

The present disclosure provides a system and apparatus configured to increase utilization and decrease downtime of the ion source 108 in the ion implantation system 101 discussed above. It shall be understood, however, that the apparatus of the present disclosure may be also implemented in other semiconductor processing equipment such as CVD, PVD, MOCVD, etching equipment, and various other semiconductor processing equipment, and all such implementations are contemplated as falling within the scope of the present disclosure. The apparatus of the present disclosure advantageously increases the length of usage of the ion source 108 between preventive maintenance cycles, and thus increases overall productivity and lifetime of the system vacuum 100.

The ion source 108 (also called an ion source chamber), for example, can be constructed using refractory metals (W, Mo, Ta, etc.) and graphite in order to provide suitable high temperature performance, whereby such materials are generally accepted by semiconductor chip manufacturers. The source gas 112 is used within the ion source 108, wherein source gas may or may not be conductive in nature. However, once the source gas 112 is cracked or fragmented, the ionized gas by-product can be very corrosive.

One example of a source gas 112 is boron tri-fluoride ($BF_3$), which can be used as a source gas to generate Boron-11 or $BF_2$ ion beams in the ion implantation system 101. During ionization of the $BF_3$ molecule, three free fluorine radicals are generated. Refractory metals, such as molybdenum and tungsten, can be used to construct or line the ion source chamber 108 in order to sustain its structural integrity at an operating temperature of around approximately 700° C. However, refractory fluoride compounds are volatile and have very high vapor pressures even at room temperature. The fluorine radicals formed within the ion source chamber 108 attack the tungsten metal (molybdenum or graphite) and form tungsten hexafluoride ($WF_6$) (molybdenum or carbon fluoride):

$$WF_6 \rightarrow W^+ + 6F^- \quad (1)$$

or $$(MoF_6 \rightarrow Mo^+ + 6F^-) \quad (2)$$

Tungsten hexafluoride will typically decompose on hot surfaces. For example, in an ion source 200 illustrated in FIG. 2, the tungsten hexafluoride or other resultant material may decompose on surfaces 202 of various internal components 203 of the ion source, such as on surfaces of a cathode 204, a repeller 206 and arc slit optics (not shown) associated an arc chamber 208 of the ion source. This is called a halogen cycle as shown in equation (1), but the resultant material can also precipitate and/or condense back onto walls 210 or liners 212 or other components of the arc chamber 208, as well as the arc slit in the form of a contaminant material 214 (e.g., solid-state particulate contaminants). The liners 212, for example, comprise replaceable members 215 operably coupled to a body 216 of the arc chamber 208, wherein the liners are comprised of graphite or various other materials. The replaceable members 215, for example, provide wear surfaces that can be easily replaced after a period of operation of the arc chamber 208.

Figure 2:
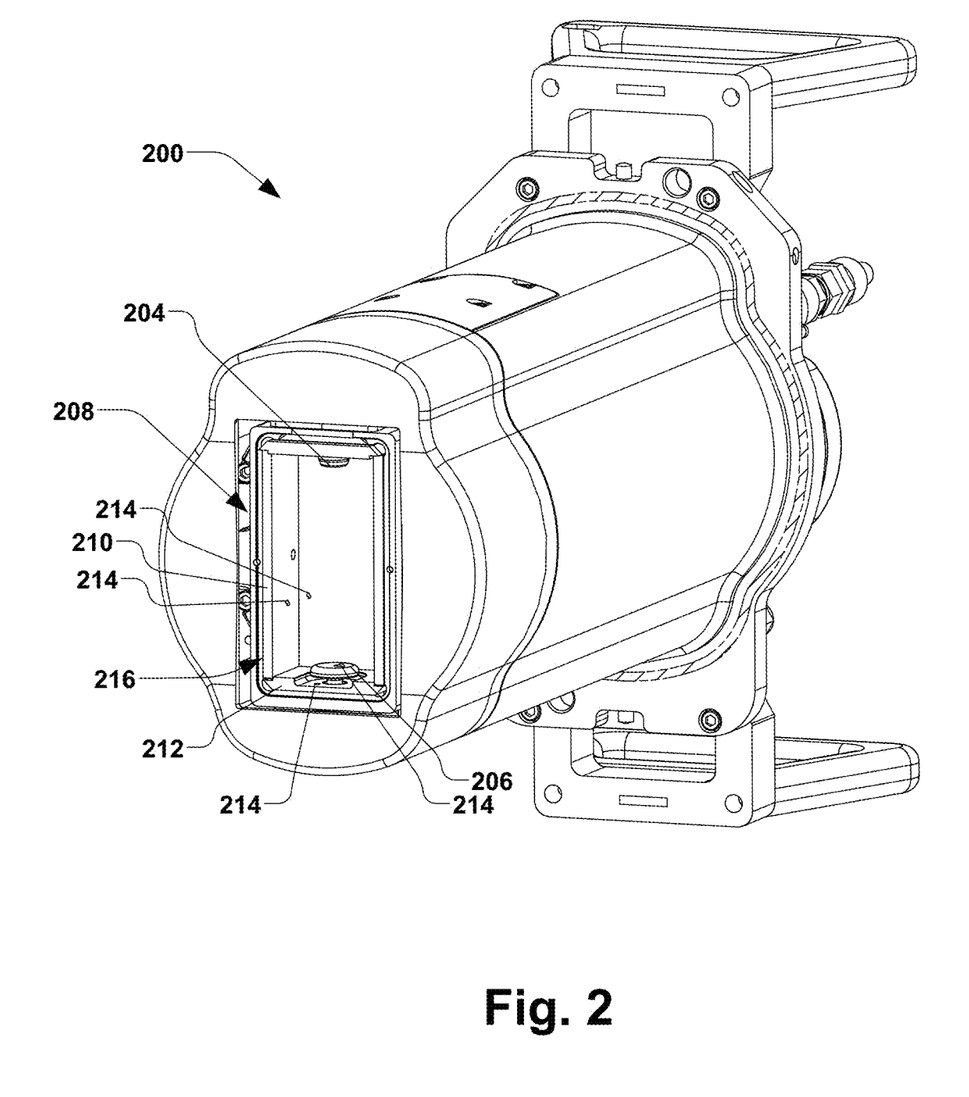
FIG. 2 is a perspective view of an exemplary ion source in accordance with several aspects of the present disclosure.

Another source of contaminant material 214 deposited onto the internal components 203 arises from the cathode 204 when the cathode is indirectly heated (e.g., a cathode composed of tungsten or tantalum), whereby the indirectly heated cathode is used to start and sustain the ion source plasma (e.g., a thermionic electron emission). The indirectly heated cathode 204 and the repeller 206 (e.g., an anti-cathode), for example, are at a negative potential in relation to the body 216 of the arc chamber 208, and both the cathode and repeller can be sputtered by the ionized gases. The repeller 206, for example, can be constructed from tungsten, molybdenum, or graphite. Yet another source of contaminant material 214 deposited on the internal components 203 of the arc chamber 208 is the dopant material (not shown), itself. Over time, these deposited films of contaminant material 214 can become stressed and subsequently delaminate, thereby shortening the life of the ion source 200.

Surface condition plays a significant role between a substrate and films deposited thereon. London dispersion force, for example, describes the weak interaction between transient dipoles or multi-poles associated with different parts of matter, accounting for a major part of the attractive van der Waals force. These results have significant implications in developing a better understanding of atomic and molecular adsorption on different metal substrates. Multiscale modeling integrating first-principles calculations with kinetic rate equation analysis shows a drastic reduction in the growth temperature from 1000° C. to 250-300° C.

As the formation of a strong atomic bond within the interfacial region is unlikely to happen, the thermal expansion coefficient differences between the substrate (e.g., the cathode 204, liners 212, and/or repeller 206) and the deposited contaminant material 214, the thermal cycling when transitioning between high power and low power ion beams, and the dissociation of implant materials residing within the uneven plasma boundary can cause premature failure. The residual stresses in these deposits are of two types: one arises from imperfections during film growth; the other is due to mismatch in the coefficients of thermal expansion between substrate and the deposited film.

The demand from device manufacturers for longer source life, increased ion beam currents, ion beam stability and non-dedicated species operation has pushed conventional ion source designs to their limits. Each of these demands are not mutually exclusive, however, whereby one or more performance characteristics are typically sacrificed to provide an ion source that does not fail prematurely.

The highly corrosive nature of fluorides and oxides generated from cracking $GeF_4$, $BF_3$, $SiF_4$, CO, and $CO_2$ challenges the conventional refractory metals used to construct the ion source 200 and components associated therewith. The formation of tungsten fluorides (e.g., $WF_x$) which subsequently decompose (e.g., via a halogen cycle) and deposit tungsten onto heated surfaces such as the cathode, repeller (e.g., anode) and arc slit optics (not shown) typically degrades performance of the ion source 200. The tungsten fluorides ($WF_x$), for example, can also react with insulators in the ion source 200, thereby forming a conductive coating that can cause ion beam instabilities and shortened lifetimes of the ion source and associated components. The formation of $WO_2$ and $WO_3$ on the internal source components, for example, can negatively impact transitions to other species, such as $^{11}B$ and $^{49}BF_2$, until the residual oxygen released from the tungsten oxides is below some threshold level.

The present disclosure utilizes lanthanated tungsten (WL) or other refractory metals alloyed with a predetermined percentage of a rare earth metal for components (e.g., internal arc chamber components) associated with the ion source 200. For example, providing such lanthanated tungsten components may advantageously eliminate the need and/or use of a co-gas such as hydrogen to tie up residual fluorine and/or oxygen to prevent the aforementioned damage to the ion source. The reaction of $F^-$ and $O^-$ with lanthanum, for example, results in a protective surface layer which is very stable at temperatures greater than 2000° C., whereas tungsten fluorides and oxides are very volatile (e.g., halogen cycle) and lead to shorter lifetimes of the ion source, as well as increased ion beam instabilities. Further, the ion source 200 of the present disclosure provides improved cathode electron emission due to its lower work function and decreased formation of tungsten carbide or oxides on the cathode tip, thus reducing cathode electron emission for carbon implants.

In addition to using lanthanated tungsten or other refractory metals alloyed with a predetermined percentage of a rare earth metal to construct the arc internal components, the arc chamber body and other components of the ion implantation system that are downstream of the arc chamber can also be constructed utilizing such a material. For example, extraction electrode optics (e.g., suppression and ground apertures) and any other downstream ion beam defining apertures, liners, and ion beam strike plates can be formed of such a lanthanated tungsten material. Any components that are susceptible to etching or sputtering by extracted fluorine or oxygen ions are considered as being candidates for being formed of such a material, where volatile corrosive conductive gases formed in conventional systems would typically coat critical insulators.

The present disclosure advantageously provides for the use of lanthanated tungsten in ion implant systems. The lanthanated tungsten material is resistant to fluorine and therefore mitigates etching and contamination issues. The lanthanated tungsten material further obviates the need for the use of certain co-gases.

Figure 3:
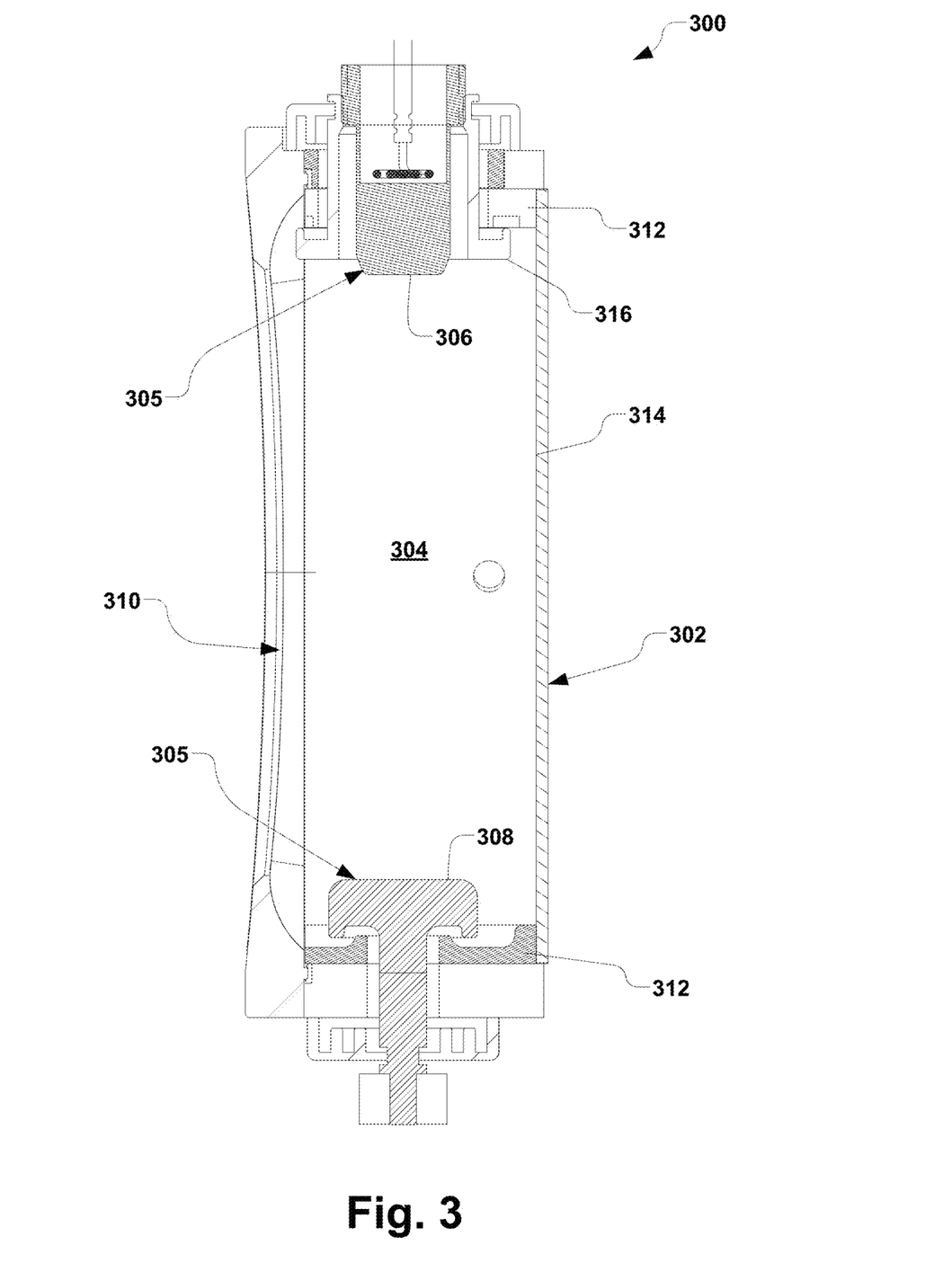
FIG. 3 illustrates an exemplary arc chamber in accordance with several aspects of the present disclosure.

In accordance with other exemplary aspects of the present disclosure, FIG. 3 illustrates another exemplary an arc chamber 300 in which the present disclosure may be utilized. The arc chamber 300 of FIG. 3 is similar in many ways to the arc chamber 208 of FIG. 2. As illustrated in FIG. 3, the arc chamber 300 has a body 302 defining and interior region 304 of the arc chamber. The arc chamber 300, for example, comprises one or more electrodes 304. The one or more electrodes 305, for example, comprise a cathode 306, and a repeller 308. The arc chamber 300, for example, further comprises an arc slit 310 for extraction of ions from the arc chamber. One or more liners 312 are operably coupled to the body 302 of the arc chamber 300. The body 302, for example, may further comprise one or more walls 314 operably coupled to, or integrated with, the body. In one example, a cathode shield 316 generally surrounds a periphery of the cathode 306.

In accordance with the present disclosure, one or more of the electrodes 305 (e.g., one or more of the cathode 306 and repeller 308), the cathode shield 316 comprise or are comprised of lanthanated tungsten. Further, one or more of the liners 312, walls 314, and/or extraction aperture 310 of the arc chamber 300 can comprise or are comprised of lanthanated tungsten. The present disclosure presently appreciates that lanthanated tungsten is more resistant to chemical attack as compared to pure tungsten used in convention ion sources. The presently considered theory is that lanthanated tungsten forms a lanthanum oxide layer on the exposed surface during the ionization process taking place in the arc chamber 300. Since this lanthanum oxide layer is chemically more stable than conventional chemistries, it generally inhibits further corrosion.

Figure 4:
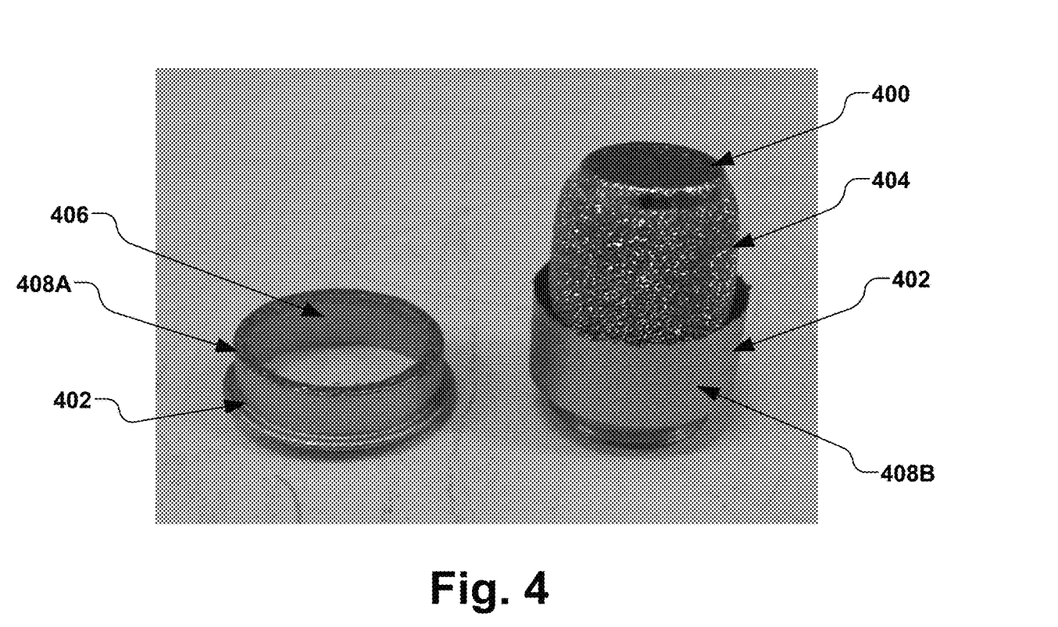
FIG. 4 illustrates a conventional tungsten cathode and shield after 20 hours of operation.

FIG. 4 illustrates a conventional cathode 400 and its corresponding cathode shield 402 (e.g., a tubular member that covers the cathode) after running carbon dioxide ($CO_2$) in an arc chamber for 20 hours, wherein the cathode and cathode shield are comprised of conventional tungsten. As illustrated in FIG. 4, severe oxidation 404 of the cathode shield 402 and its subsequent deposition through thermal decomposition onto a sidewall 406 of the cathode 400 are present. As illustrated, the cathode shield 402 has been oxidized such that the cathode shield has been deleteriously separated into two pieces 408A, 408B.

Figure 5:
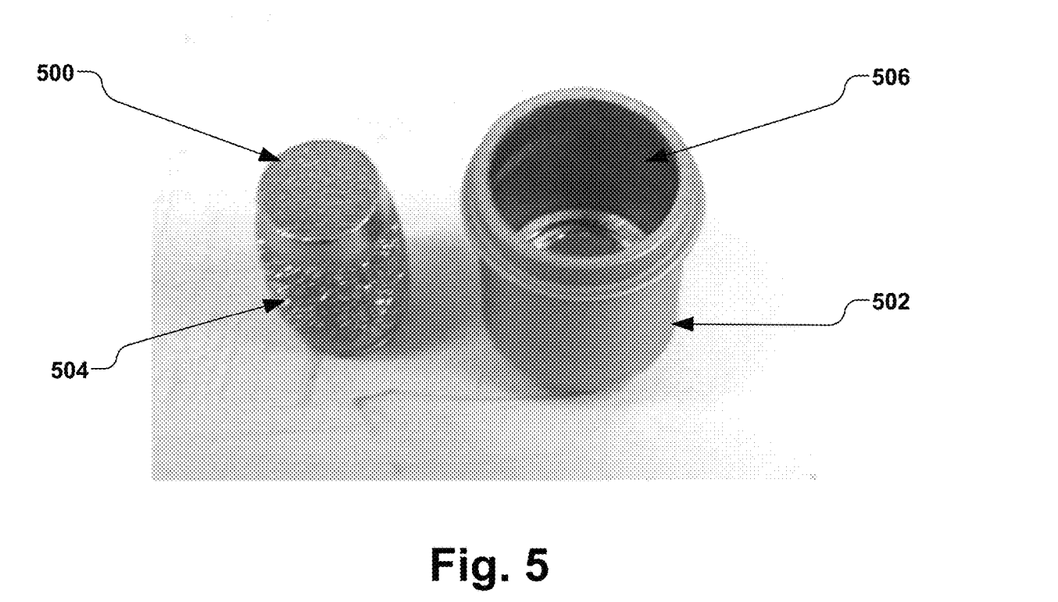
FIG. 5 illustrates a lanthanated tungsten cathode and shield after 20 hours of operation in accordance with several aspects of the present disclosure.

FIG. 5 illustrates cathode 500 and corresponding cathode shield 502 of the present disclosure after similarly running carbon dioxide ($CO_2$) in an arc chamber for 20 hours, wherein the cathode and cathode shield are comprised of lanthanum tungsten. As illustrated in FIG. 5 the reduction in the oxidation 504 of the cathode shield 502 and reduced tungsten deposition onto a sidewall 506 of the cathode is readily apparent when compared to the conventional cathode 400 and cathode shield 402 of FIG. 4.

Figure 6:
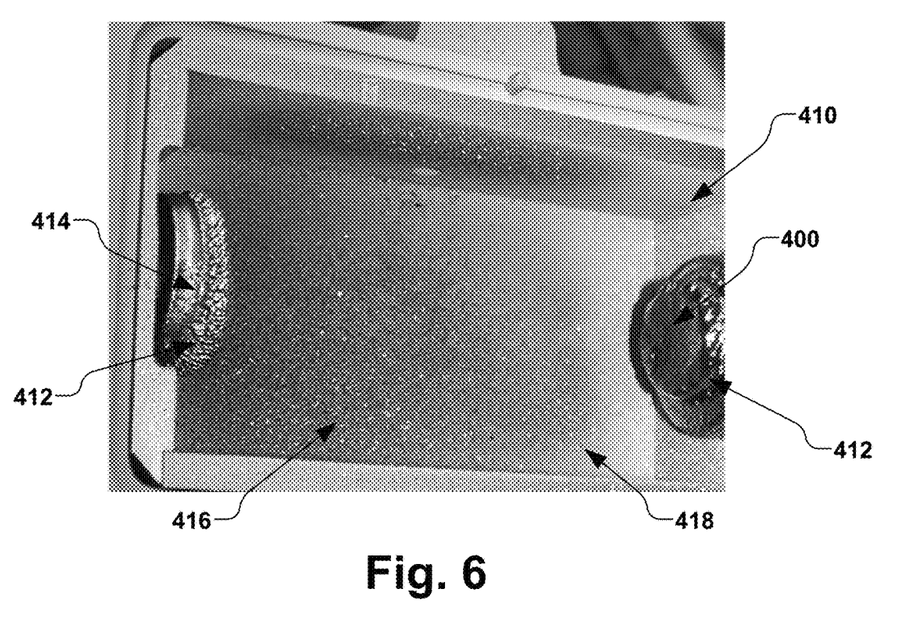
FIG. 6 illustrates a conventional arc chamber after running 30 hours with no co-gas.

FIG. 6 illustrates the conventional cathode 400 of FIG. 4 in a conventional arc chamber 410 after running 30 hours of $GeF_4$ with no co-gas. Excessive deposition 412 of tungsten onto the cathode 400 and the repeller 414 and the etching 416 of arc chamber liners 418 is clearly present.

Figure 7:
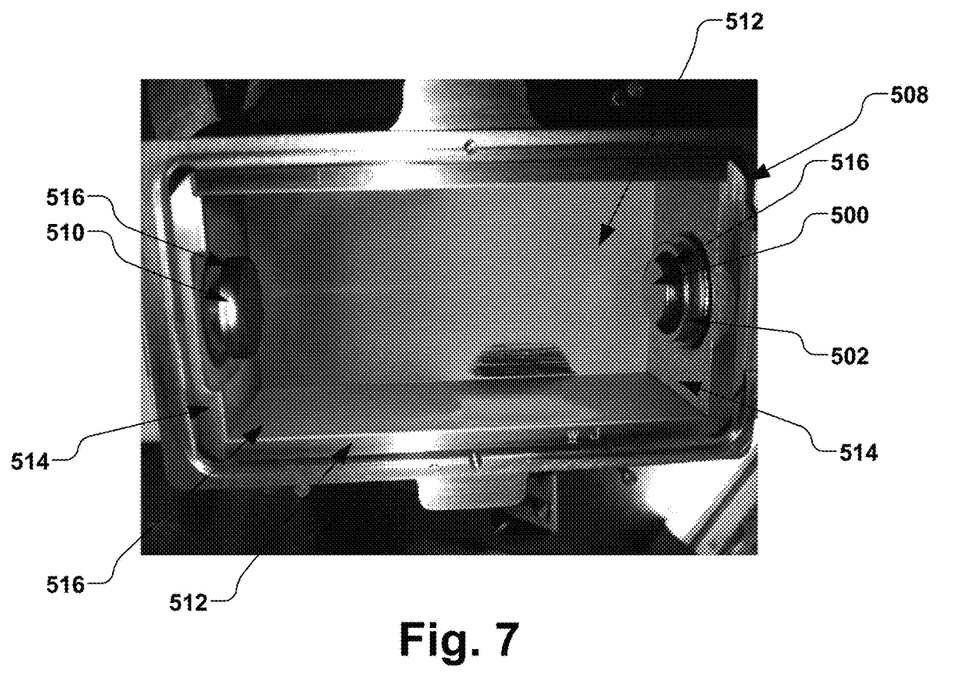
FIG. 7 illustrates a lanthanated tungsten arc chamber after running 30 hours with various source materials with no co-gas in accordance with several aspects of the present disclosure.

FIG. 7 illustrates an arc chamber 508 of the present disclosure having one or more components, such as one or more of the cathode 500, cathode shield 502, repeller 510, chamber walls 512, liners 514, and extraction aperture (not shown) comprised of lanthanum tungsten after running GeF4, SiF4 and BF3 with no co-gas for 10 hours each. While all exposed surfaces 516 within the arc chamber 508 illustrated in FIG. 7 are comprised of lanthanated tungsten, such an example is not to be considered limiting, whereby some components may not be comprised of lanthanated tungsten, or may comprise a coating of lanthanated tungsten. As shown in FIG. 7 there is no significant deposition of tungsten onto the cathode 500 and the repeller 510 (e.g., no halogen cycle is present), and there are minimal signs of etching of the arc chamber liner(s) 514. It is further noted that the present disclosure can advantageously eliminate running a co-gas when running CO and $CO_2$.

Figure 8:
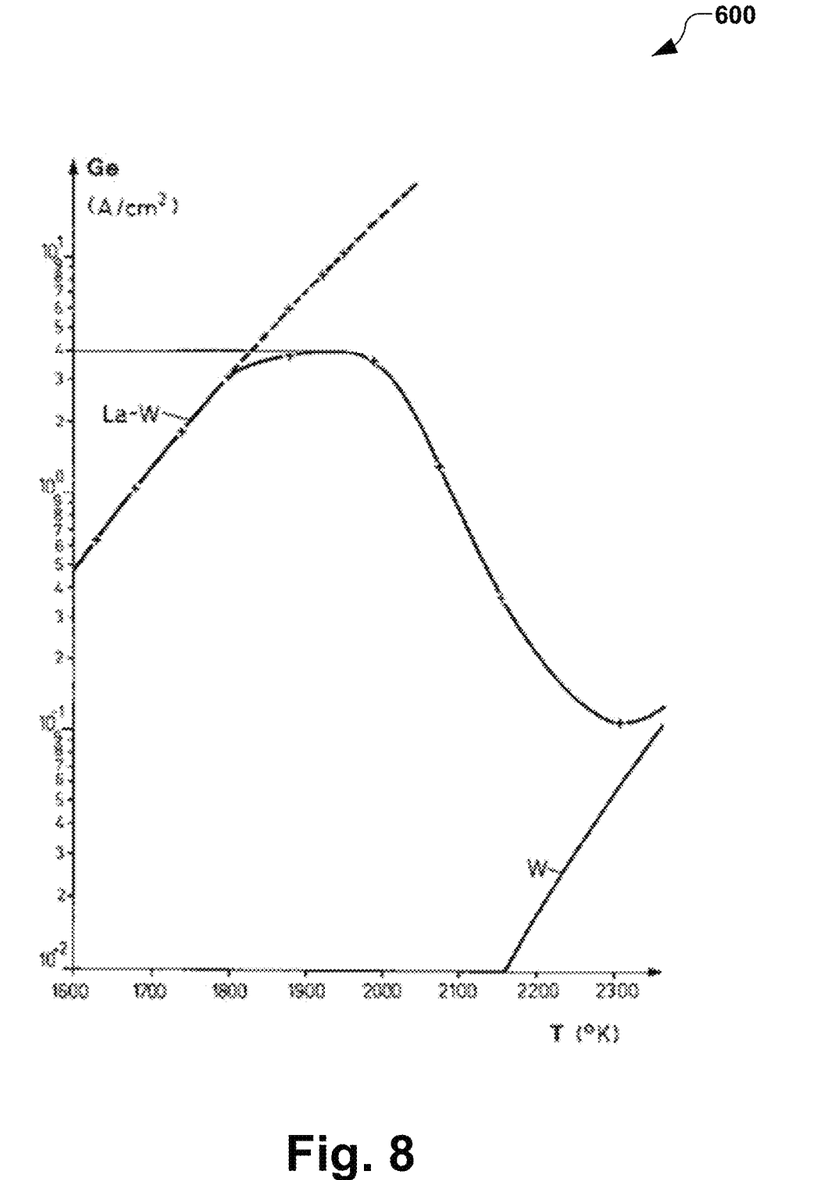
FIG. 8 illustrates a graph of emission characteristics of pure tungsten and lanthanated tungsten in accordance with several aspects of the present disclosure.

FIG. 8 is graph 600 illustrating emission characteristics of pure tungsten and lanthanated tungsten, where the maximum stable emission of 4 $A/cm^2$ is at 1900 K (e.g., reference to thoriated tungsten of 3 $A/cm^2$ at 2100 K). Thermionic emission for pure tungsten, for example, is one hundred times less at ~2300K.

Figure 9:
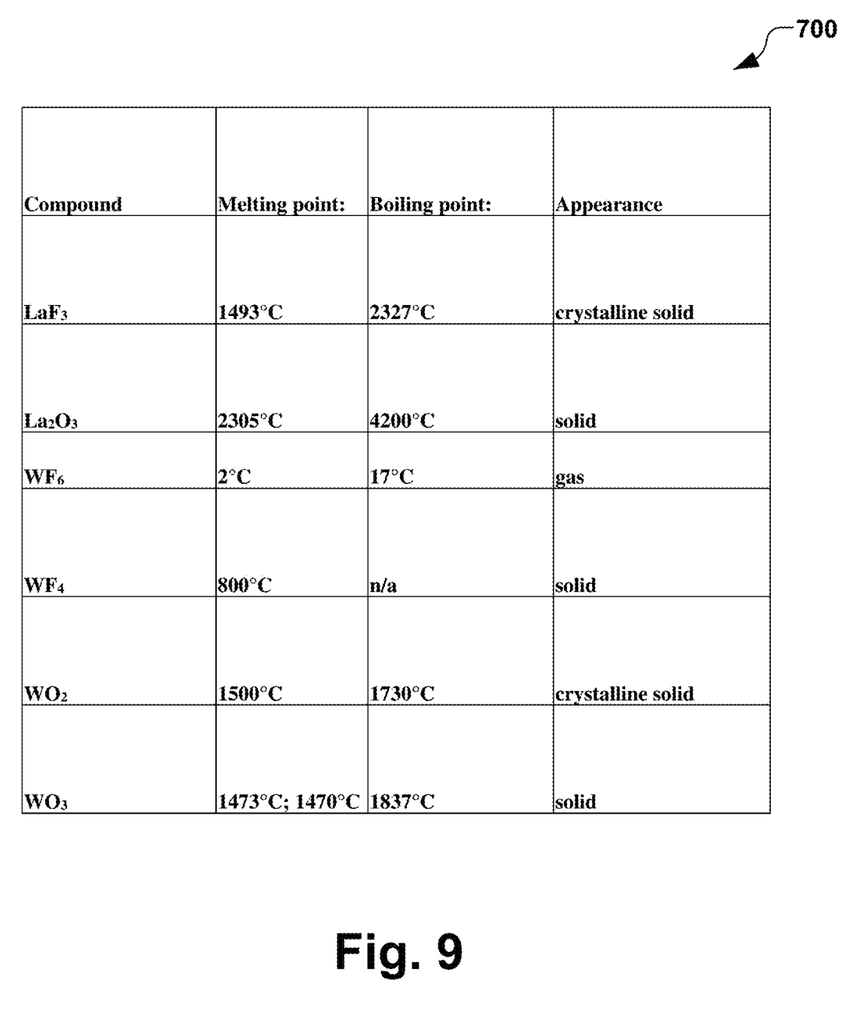
FIG. 9 is a chart illustrating various characteristics of various compounds in accordance with several aspects of the present disclosure.

FIG. 9 is a table 700 illustrating characteristics for various materials after reacting with fluorine and oxygen. Lanthanum oxide, for example, has a melting point approximately 1000 C higher than standard tungsten dioxide, which indicating that lanthanum oxide is much more stable. The arc chamber liners described above typically operate at approximately 700-800 C, whereby the cathode operates at approximately 2500 C, and the cathode shield operates at approximately 2000 C. Accordingly, components of the arc chamber being comprised of lanthanated tungsten provide a stable compound which doesn't break down easily at high temperatures after reacting with fluorine.

The present disclosure thus provides lanthanated tungsten as an alloy or mixed with other refractory metals (e.g., molybdenum, tantalum, etc.) for construction of the arc chamber (e.g., ion source chamber) and/or other electrode components. The present disclosure provides a lanthanated alloy having a predetermined amount of lanthanum (e.g., 1-3% lanthanum powder). For example, the predetermined amount of lanthanum is mixed with the desired metal (e.g., tungsten) and isostatically pressed to form the component. The lanthanated tungsten, for example, may define the whole component, or the component may be coated or otherwise deposited over the component.

When lanthanated tungsten components of the present disclosure are exposed to process gases, for example, the resulting compounds are generally stable at operation temperatures of the ion source. For example, $La_2F_3$ is formed in the presence of fluorine, and is stable up to greater than 2000 C. Thus, surfaces associated with the ion source can be considered to be passivated. Likewise, when lanthanated tungsten is exposed to oxygen in process conditions, an oxide compound is formed, which is also quite stable. Thus, the lanthanated tungsten "ties up" the fluorine or oxygen and generally prevents the fluorine or oxygen from etching tungsten off the components. In one example, any component that is exposed to the plasma in the arc chamber comprises or is comprised of lanthanated tungsten.

A halogen cycle associated with fluorine (e.g., $WF_6$), for example, when exposed to a hot surface, provides a gas that is volatile and subsequently decomposes, leaving residual tungsten behind, whereby the fluorine goes back into the plasma to scavenge more tungsten. By providing the components exposed to the plasma as being comprised of lanthanated tungsten, the halogen cycle is basically eliminated or broken. As such, less $WF_6$ is formed, and less material is present to decompose on the hot surfaces to make them increase in mass, etc.

Conventionally, halogen cycles have been problematic when fluorine-based dopant gases are utilized. Germanium, for example, is a worst case, followed by $BF_3$ and $SiF_4$, whereby the liners and other components of the ion source are conventionally etched, pitted, etc. When used with oxygen, the cathode may be oxidized. When used with tungsten, $WO_2$ is formed. Deposits of carbon on the cathode can further create tungsten carbide. Because the cathode is indirectly heated, it will emit electrons at approximately 2500 C. When this happens, the source does not emit electrons, whereby plasma arc current drops, plasma density drops, and ion beam current drops. By providing the cathode as being comprised of lanthanated tungsten, for example, there is also no need to run the co-gas with carbon. The ion source may be operated with no co-gas because the emissivity of the cathode is reduced (e.g., 100 times better than standard tungsten) due to the lanthanum. As such, the ion source generally protects itself, its work function is lower, and it can emit electrons more easily at a lower power.

When running carbons with oxygens (or any gas with oxygen), a significant amount of tungsten dioxide and tungsten trioxide can be formed in the arc chamber. When a subsequent transition to boron ($BO_3$) is desired, the ion source is unstable until the oxygen disposed therein is removed. Thus, until the oxygen is removed, the previous tuning solution associated with the ion source will not work well. Thus, in accordance with the present disclosure, since there is no tungsten dioxide formed, the lanthanated tungsten provides for a passivating of the chamber, thus protecting it, and not forming a significant amount of $WO_2$ or $WO_3$.

In accordance with one example, extraction electrodes utilized in extract the ions from the ion source (e.g., optics plates) can comprise or otherwise be made of lanthanated tungsten. When fluorine is utilized in a conventional tungsten extraction electrode, for example, the fluorine will sputter the apertures and combine to form tungsten fluoride (WF) gas, which is corrosive. Further, insulators are often provided between the extraction plates, whereby the fluorinated tungsten will attack the insulators ($Al_2O_3$), which further creates a deleterious conductive coating on the insulator. Thus, in accordance with the present disclosure, the aperture plates are comprised of lanthanated tungsten, thus mitigating such deleterious conduction.

The present disclosure further contemplates components upstream of the mass analyzer 116 (e.g., AMU magnet) of FIG. 1 to be comprised of lanthanated tungsten, such as the ion source 108, extraction electrodes 115, and components of the ion source chamber. Arc chamber internal components may be comprised of lanthanated tungsten, such as any liners, arc slit, cathode, repeller, and cathode shield associated with the ion source chamber, as described above. Further, the entrance 116 to the mass analyzer 117 can also be comprised of lanthanated tungsten. Additionally, components further downstream of mass analyzer 117 (e.g., anywhere along the beamline) may be comprised of lanthanated tungsten in a similar manner.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. A conductive component for an ion source in an ion implantation system, wherein the conductive component comprises a lanthanated alloy comprising lanthanated tungsten mixed with a refractory metal, wherein the refractory metal comprises one or more of molybdenum and tantalum, and wherein the conductive component is generally passivated during an operation of the ion implantation system.

2. The conductive component of claim 1, wherein the lanthanated alloy comprises between 1% and 3% lanthanum.

3. The conductive component of claim 1, wherein the conductive component is coated with the lanthanated alloy.

4. The conductive component of claim 1, wherein the conductive component comprises an aperture plate.

5. The conductive component of claim 1, wherein the conductive component comprises a cathode.

6. The conductive component of claim 1, wherein the conductive component comprises a cathode shield.

7. The conductive component of claim 1, wherein the conductive component comprises a repeller.

8. The conductive component of claim 1, wherein the conductive component comprises a strike plate.

9. A conductive component for an ion source in an ion implantation system, wherein the conductive component comprises a lanthanated alloy comprising lanthanated tungsten mixed with a refractory metal, wherein the lanthanated alloy comprises between 1% and 3% lanthanum powder, and wherein the conductive component is generally passivated during an operation of the ion implantation system.

10. The conductive component of claim 9, wherein the conductive component is coated with the lanthanated alloy.

11. The conductive component of claim 9, wherein the conductive component comprises an aperture plate.

12. The conductive component of claim 9, wherein the conductive component comprises one or more of a cathode and a cathode shield.

13. The conductive component of claim 9, wherein the conductive component comprises a repeller.

14. The conductive component of claim 9, wherein the conductive component comprises a strike plate.

\* \* \* \* \*